US007123046B2

(12) United States Patent
Keeth

(10) Patent No.: US 7,123,046 B2
(45) Date of Patent: Oct. 17, 2006

(54) APPARATUS FOR ADAPTIVELY ADJUSTING A DATA RECEIVER

(75) Inventor: Brent Keeth, Boise, ID (US)

(73) Assignee: Micron Technology, INC, Boise, ID (US)

( * ) Notice: Subject to any disclaimer, the term of this patent is extended or adjusted under 35 U.S.C. 154(b) by 910 days.

(21) Appl. No.: 10/075,189

(22) Filed: Feb. 13, 2002

(65) Prior Publication Data

US 2003/0153140 A1  Aug. 14, 2003

(51) Int. Cl.
 *H03K 17/16* (2006.01)
(52) U.S. Cl. .............................. 326/26; 326/83; 326/87
(58) Field of Classification Search ................. 326/26, 326/27, 83–87, 89
See application file for complete search history.

(56) References Cited

U.S. PATENT DOCUMENTS

| 5,376,847 | A |  | 12/1994 | Staszewski | .................. 327/12 |
| 5,608,343 | A |  | 3/1997 | Ojima et al. | .................. 326/93 |
| 5,619,148 | A |  | 4/1997 | Guo | .............................. 327/3 |
| 5,744,983 | A |  | 4/1998 | Bazes | ............................. 327/3 |
| 5,751,166 | A |  | 5/1998 | Shieh et al. | .................. 326/71 |
| 5,764,703 | A |  | 6/1998 | Charvin et al. | ............. 375/317 |
| 5,898,321 | A | * | 4/1999 | Ilkbahar et al. | ............. 326/87 |
| 6,118,731 | A |  | 9/2000 | Huang et al. | ............... 365/233 |
| 6,339,343 | B1 | * | 1/2002 | Kim et al. | ..................... 326/83 |

FOREIGN PATENT DOCUMENTS

EP        0606979 A2    7/1994

* cited by examiner

*Primary Examiner*—Don Le
(74) *Attorney, Agent, or Firm*—Schwegman, Lundberg, Woessner & Kluth, P.A.

(57) ABSTRACT

Offsets and timing skews in data signals captured in a data receiver are reduced by adaptively adjusting a transition threshold of the data receiver. A data corrector provides a set of adjustment vectors for adjusting the transition threshold of the data receiver. The data corrector uses differential clock signals and a reference voltage to generate the set of adjustment vectors to be provided to the data receivers. The data receiver is an improved receiver incorporating a trip point adjustor that receives the set of adjustment vectors from the data corrector to adjust its trip point relative to the reference voltage.

24 Claims, 10 Drawing Sheets

APPARATUS FOR ADAPTIVELY ADJUSTING A DATA RECEIVER

TECHNICAL FIELD OF THE INVENTION

This invention relates generally to integrated circuit devices such as a memory device. More particularly, the present invention relates to a system and process for adjusting parameters of data receivers used in integrated circuit devices.

BACKGROUND OF THE INVENTION

Integrated circuit devices have long been the building blocks for a wide variety of applications. One of the largest applications for integrated circuits has been in the field of digital computers, where the development of smaller feature sizes for the integrated circuit has allowed for greater capacity and flexibility in operating a digital computer. In particular, the developments in integrated circuits have provided for increased memory capacity and different types of memory devices. One such memory device is the Double Data Rate Dynamic Random Access Memory, referred to as DDR DRAM.

DDR DRAM transfers data at both the rising and falling edge of a clock signal, unlike traditional SDRAM, which transfers data only on the rising edge of a clock signal. In operation, DDR and similar memory devices utilize differential signaling for clock signals at clock pins of a device package. Differential signaling for these clock signals reduces sensitivity to common mode voltages to enable the production of a stable internal timing reference. Typically, a differential signal provides good signal integrity from which a balanced receiver can be built that maintains good duty cycle performance internally. However, DDR and similar memory devices utilize non-differential signaling for data signals input on the device data pins. The received data signals are compared to a voltage reference voltage supplied by the system. The lack of differential signaling for the received data signals introduces sensitivities to both the common mode signal voltage and reference voltage levels. As a result, the received data signals exhibit timing skew relative to the received clock signals, when the signaling levels depart from ideal.

The non-differential signals and their sensitivity to the system voltage reference, VREF, may result in data signal offsets, which requires some compromise in building the receivers used in applications such as memory devices. As a result of these design compromises, the internal signals after capture generally do not have the same duty cycle integrity as the system clock signal. This reduction in duty cycle integrity could be due to several reasons. Imbalances in the memory buffers can occur during wafer processing due to variations between p-type channel devices and n-type channel devices in drive strength that can vary from wafer to wafer. Invariably, the p to n drive strength ratios are not as balanced as initially designed. This variation from the design is a factor when examining the received data signal relative to VREF.

The data signal is examined relative to a trip point of a data receiver. A trip point is essentially the transition point, or transition threshold, at which the data receiver transitions from a one to a zero, that is, the point at which, when the input changes from one level to another, the output changes from one level to another. Ideally, the trip point should be exactly equal to VREF. As the received data signal transitions through the voltage level represented by VREF, the output of the receiver will transition from one state to another. Thus, the data signals are being examined relative to the VREF level in the circuitry of the data receivers using p-type and n-type device elements. With imbalances from the design in the p to n drive strength ratio, the trip point may be somewhat shifted from VREF. As a result, imbalances in a duty cycle may occur, or the rise and fall times of the data signal and that of a data buffer may not be matched as desired. As a result, some timing skews relative to the received clock signal may occur. Then, generally, as data is sent from the data receivers to data latches, any kind of timing skew incurred in the data receivers translates into set-up and hold timing problems.

Generally, VREF is a reference voltage set as one-half the power supply. If data signals swing from VSS to VDD, VREF should be (VDD−VSS)/2. The ideal level for VREF is to be perfectly centered in the signal swing. If VREF is not centered in the signal swing, the output duty cycle from the data receiver can be affected. Further, any noise on the VREF input to the receiver could potentially affect the timing of the output signal in a high speed device. In a high speed device, the design intent is to guarantee certain set up and hold times, such that measured from where the clock makes a transition, there is a certain set up time requirement where data has to be transitioned and settled before the clock transition occurs. At higher frequencies, the set up and hold time is smaller, thus any errors or deviations from design created on the chip die will negatively affect set up and hold times. In addition to making integrated circuits as accurate as possible, there is a need to correct for imbalances in the transistors in the integrated circuit, and correct for DC offsets in the VREF signal.

Typically, once the integrated circuit has been made, data signal offsets and timing skews are not corrected during operation of the processed integrated circuit. A problem dealing with adjusting timing offsets of a digital signal relative to a coincident clock signal has been addressed in U.S. Pat. No. 6,029,250, entitled "Method and Apparatus for Adaptively Adjusting the Timing Offset Between a Clock Signal and Digital Signals Transmitted Coincident with that Clock Signal, and Memory Device and System Using the Same," and assigned to the assignee of the present invention. In the above patent, a number of digital signals with respective timing offsets are stored and evaluated, where one of the timing offsets from the number of digital signals stored is selected to be used to adjust the timing offsets for the digital signals. Such an approach will not fully address the problems previously discussed. There remains a need for correcting data signaling offsets and timing skews in a data receiver as it operates. The present invention provides a solution to this problem.

DESCRIPTION OF THE PREFERRED EMBODIMENTS

Figure 1:
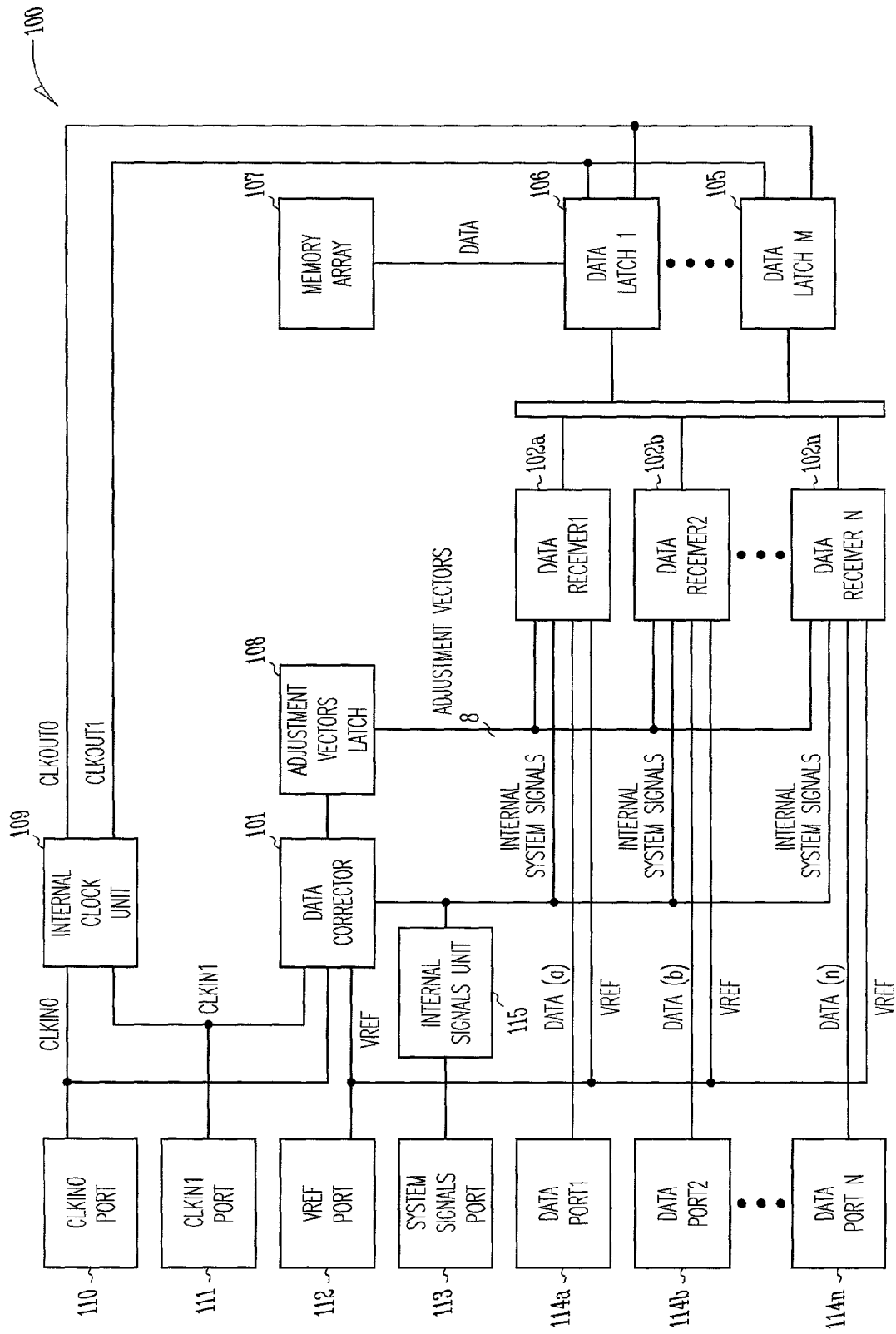
FIG. 1 is a block diagram of a memory device depicting elements of the memory device including a data corrector in accordance with the present invention.

In the following detailed description of the preferred embodiments, reference is made to the accompanying drawings which form a part hereof, and in which is shown by way of illustration specific preferred embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present invention is defined only by the appended claims and their equivalents.

The term, VCC, refers to a supply voltage that is used to provide operating voltages for the electronic elements used in accordance with the present invention. The terms, VDD and VSS, refer to voltages supplying the necessary voltages to a drain and a source, respectively, for n-type and p-type FETs and MOS transistors needed for operation of these transistors. For a particular transistor, its VDD and/or VSS is VCC reduced by a voltage drop across some load, as should be understood by those skilled in the art.

In an embodiment, an electronic device includes a data corrector that provides adjustment information for adjusting the trip point of data receivers included in the electronic device. For offsets in the trip point from a reference voltage, VREF, the data corrector provides adjustment signals that shift the trip point of the data receivers in the electronic device relative to VREF. The data corrector uses differential clock signals, and VREF to generate the set of adjustment signals.

In another embodiment of the present invention, a data receiver includes a receiver having a trip point, and a trip point adjustor. The trip point adjustor uses received adjustment vectors to provide signals to the receiver for adjusting the receiver's trip point.

In another embodiment of the present invention, a data corrector includes a pair of ancillary data receivers and a corrector controller that provides the ancillary data receivers with adjustment vectors. The corrector controller also supplies adjustment vectors to data receivers external to the data corrector. A voltage reference, VREF, is coupled to the ancillary data receivers, along with coupling differential clock signals at the data ports to the ancillary data receivers. The output signals of the ancillary data receivers are compared by a phase detector to determine if they cross concurrently at a zero point for a signal transition (high to low or low to high). If these output signals do not cross concurrently, adjustment vectors are generated and coupled to the ancillary data receivers to adjust their trip point relative to (VCC/2). Adjustment vectors are continually supplied to the two ancillary data receivers, adjusting their trip point until their output signals cross concurrently. The adjustment vectors that result in the output signals from the ancillary data receivers crossing concurrently are selected as the adjustment vectors that the corrector controller supplies to data receivers external to the data corrector.

In another embodiment of the present invention, a phase detector includes circuitry for balancing two signals and comparing a zero crossing of the two signals. The phase detector compares the rising edge of one clock signal with the falling edge of the other clock signal.

In another embodiment of the present invention, a processing system includes a central processing unit, and a plurality of memory devices having a data corrector for supplying adjustment vectors to the data receivers included in each memory device. The memory device receives differential system clocks, and a voltage reference, VREF, to generate the adjustment vectors for the data receivers in the memory devices.

In another embodiment of the present invention, a method of operating a data corrector includes providing two clock signals to a pair of ancillary data receivers, determining a difference between the output signals of the ancillary data receivers, and generating adjustment vectors correlated to the difference in the output signals of the ancillary data receivers. One clock signal is coupled to the data port of one ancillary data receiver, and the other clock signal is coupled to the data port of the other ancillary data receiver.

FIG. 1 shows a block diagram of a portion of a memory device 100 depicting elements of memory device 100 including a data corrector 101 in accordance with the present invention. Data signals are received by memory device 100 at data ports 114a–114n. The data signals at these data ports are coupled to data receivers 102a–102n for further processing. Typically, these data ports may be data pins on an integrated circuit. The data signals may include data to be stored in memory array 107, commands, or address signals. Various other system signals are received by memory device 100 at a system signals port 113 for operating memory device 100 in conjunction with external systems. System signals port 113 provides system signals to internal signals unit 115 used to generate internal system signals for operating memory device 100 including a BIAS signal, an enable signal EN, a RESET signal, and VCC.

Transferring data throughout a memory device is accomplished in conjunction with stable timing signals. For instance, as data is distributed from data receivers to other functional sections of memory device 100, it is first clocked into data latches such as data latches 105, 106. Data latches 105, 106 and other data latches receive clock signals to move data in and out of the latches. Two stable clock signals, CLKOUT0 and CLKOUT1, are provided by the internal clock unit 109 for internal use in memory device 100. However, the clock signals, CLKOUT0 and CLKOUT1, from internal clock unit 109 are generated from differential clock signals that memory device 100 receives from an external system, typically from a unit on a motherboard of a system to which the memory device is coupled. The differential system clock signals, CLKIN0 and CLKIN1, are received at a CLKIN0 port 110 and a CLKIN1 port 111, respectively, and coupled to the internal clock unit 109. The differential system clock signals are also used to generate adjustment vectors by data corrector 101 for adjusting the trip points of the data receivers 102a–102n. In addition to being coupled to the CLKIN0 port 110 and the CLKIN1 port 111 to receive the differential system clock signals, data corrector 101 is coupled to a VREF port 112 for receiving a system reference voltage, VREF, that forms a basis for the operation of data corrector 101.

The main function of data corrector 101 is to generate adjustment vectors that are used internal to data corrector 101 in a feedback manner, and are supplied to data receivers external to data corrector 101, once operating parameters within data corrector 101 are meet. The adjustment vectors are 8 bit vectors configured in two 4 bit pairs. The adjustment vectors that are supplied externally by data corrector 101 are held in an adjustment vector latch 108 that is coupled via 8 lines between data corrector 101 and the data receivers 102a–102n. The control logic for sending adjustment vectors to the data receivers is maintained within data corrector 101. Alternately, adjustment vector latch 108 can be incorporated into data corrector 101.

In determining the adjustment vectors, the received differential clock signals, CLKIN0 and CLKIN1, are used to determine the corrections to be made in the data receivers 102a–102n. CLKIN0 and CLKIN1 are free running clock signals, that is, continuously cycling signals with definite transitions. Data corrector 101 examines CLKIN0 and CLKIN1 relative to VREF. Using CLKIN0 and CLKIN1 as data signals, data corrector 101 determines adjustment information for adjusting data offsets, not to adjust for VREF, but to adjust or modify trip points of data receivers. Once data corrector 101 has determined, within data corrector 101, the amount of adjustment needed to adjust a trip point towards (VCC/2), which is ideally set at the 50% point of a data signal, it provides information signals to adjust the trip points of data receivers 101a–n. The detailed description of data corrector 101 and its functional units will be provided in further discussions to follow.

It should be understood by those skilled in the art that the elements of the block diagram of FIG. 1 are some of the functional elements of a memory device, and not all elements of a memory device are depicted. FIG. 1 includes those functional elements that are necessary to practice the present invention. In one embodiment of the present invention, the memory device 100 is an integrated circuit wherein the ports represented as 110–114a–n are pins of the integrated circuit. In another embodiment, memory device 100 is a die wherein the ports represented as 110–114a–n are the contact pads formed in the die, and the functional units of the memory device are fabricated in the die using standard fabrication methods as is known to those skilled in the art.

Advantageously, in accordance with the present invention, it is anticipated that the functioning of memory buffers within a memory device will be enhanced. Adaptively adjusting the trip point of data receivers to correct for offsets and timing skews in a data signal will extend the range and timing accuracy of input buffers of the memory device that use these data receivers.

Figure 2:
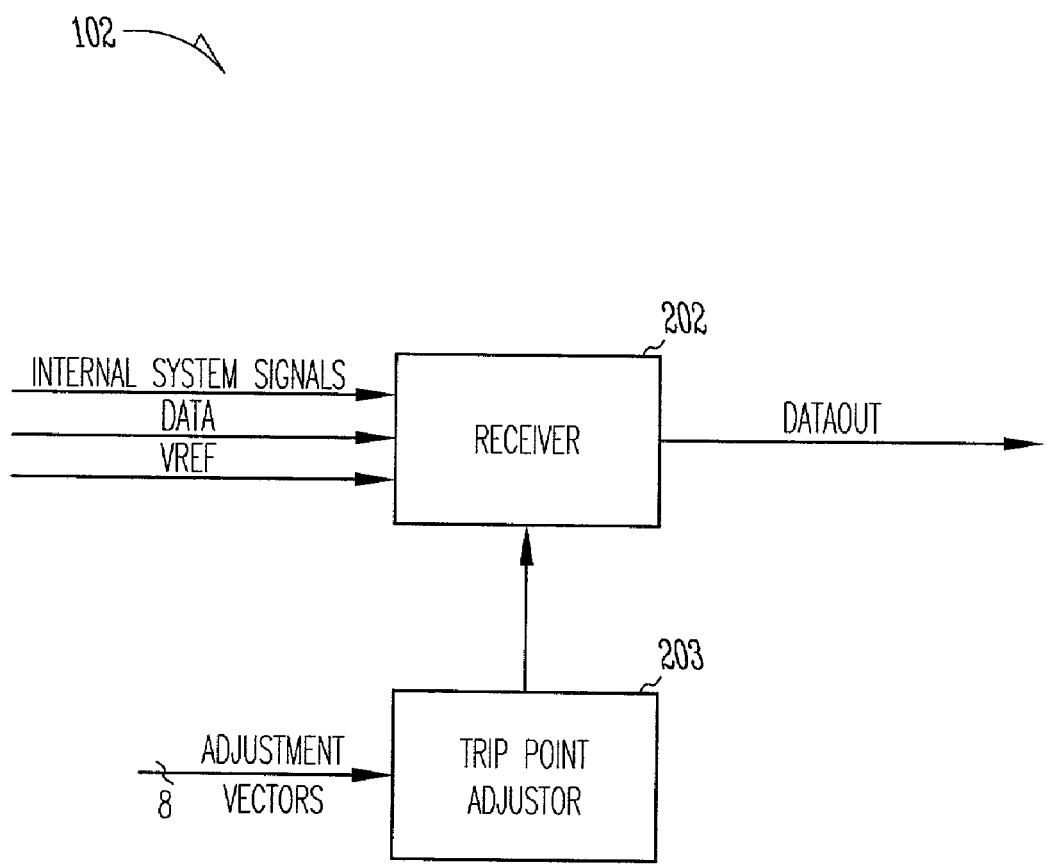
FIG. 2 is a block diagram of a data receiver having a trip point adjustor in accordance with the present invention.

FIG. 2 depicts a block diagram for a data receiver 102 including a receiver 202 and a trip point adjustor 203. Receiver 202 has a trip point, which is a reference level, or transition point, such that as the input changes from one level to another, the output changes from one level to another. The trip point is essentially that transition point for judging an input as high or low, depending on the type logic used. Ideally, the trip point is set at the level of (VCC/2).

The structural details of data receiver 102 are used for fabricating the data receivers 102a–102n of FIG. 1. Data is received by receiver 202 from one of the data ports 114a–114n of memory device 100 of FIG. 1. Receiver 202 provides a DATAOUT signal to a latch, such as latch 105 of FIG. 1. If there is no offset in the data in receiver 202, the DATAOUT signal will essentially be the data into receiver 202. The function of trip point adjustor 203 is to compensate receiver 202 to eliminate or reduce any offsets to the data. Trip point adjustor 203 receives adjustment vectors from data corrector 101 of FIG. 1. Trip point adjustor 203 is coupled to receiver 202 to apply the signals of the received adjustment vectors to receiver 202. Applying the signals of the received adjustment vectors pulls the trip point level down or pulls the trip level up based on the adjustment vectors that the trip point adjustor receives. Essentially, the signals of the adjustment vectors turn on a set of transistors in trip point adjustor 203 that modifies a biasing voltage in receiver 202 by increasing or decreasing the biasing voltage.

In data receiver 102, the design for receiver 202 can be a standard receiver known to those skilled in the art. Based on the design of receiver 202, trip point adjustor 203 would be of a design that would allow the coupling of trip point adjustor 203 with receiver 202, which would result in modifying the trip point of receiver 202 based on the adjustment vectors received by the trip point adjustor. Thus, the design of the trip point adjustor would be dependent upon the topology of receiver 202 used in forming data receiver 102. A differential pair receiver can be used as receiver 202. In an embodiment for a data receiver 102, a modified Bazes receiver is used as is discussed in the following detailed description of data receiver 102.

The term Bazes receiver is used to describe a receiver using the basic topology as disclosed by M. Bazes, *IEEE Journal of Solid-State Circuits*, vol. 26: No. 2, pp. 165–168 (1991). This receiver could also be referred to as a self-biased receiver. The Bazes receiver does not have a means for adjusting its trip point.

Figure 3:
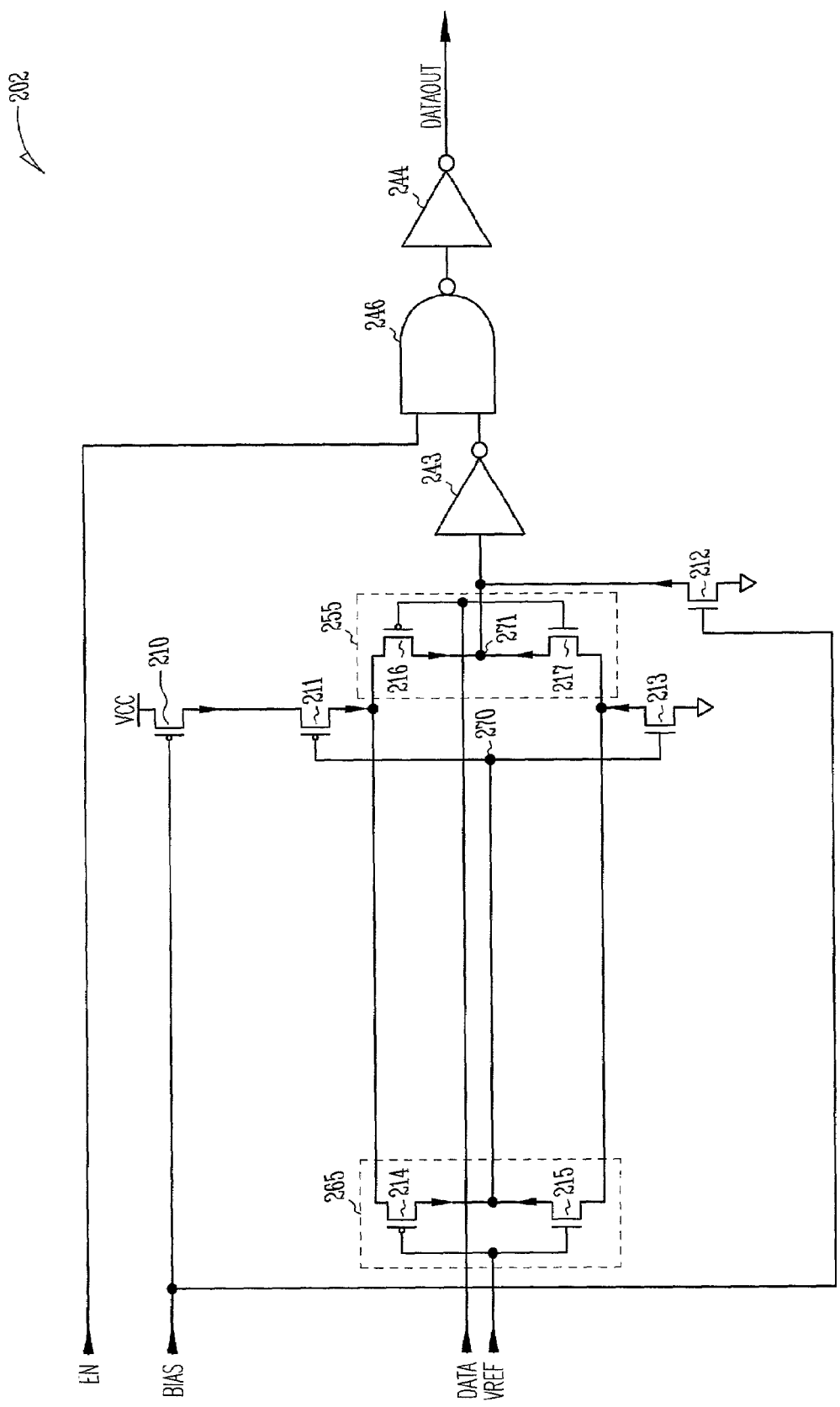
FIG. 3 depicts a receiver portion of a data receiver without a trip point adjustor.

FIG. 3 depicts a receiver 202 that does not have a trip point adjustor, which is a portion of receiver 102 of FIG. 2. Receiver 202 utilizes the basic elements of a self-biased amplifier discussed in the aforementioned article. It uses two input signals, a DATA signal received from a data port such as data port 114 of FIG. 1, and VREF received from VREF port 112 of FIG. 1. The EN signal is an enable signal that essentially turns the receiver to an active state. It is one of the group of signals provided from internal signals unit 115 of FIG. 1. The BIAS signal is also provided within the group of signals from internal signals unit 115 of FIG. 1. The BIAS signal is a DC voltage level applied to the gate of the p-type MOS transistor 210 and to the gate of the n-type MOS transistor 212. BIAS is set at the low logic level turning p-type MOS transistor 210 on and n-type MOS transistor 212 off. With receiver 202 enabled, the BIAS level is set such that the p-type MOS transistor 210 is continuously on providing a bias load, and the grounding transistor 212 is off. When the receiver is to be turned off, the BIAS level is set to the high logic level turning off transistor 210 and turning on transistor 212 to ground the signal at an output node 271. The BIAS signal and EN signal are operated together to turn-off receiver 202.

The basic elements for a Bazes receiver used for receiver 202 are p-type MOS transistors 211, 214 and 216, and n-type MOS transistors 213, 215, and 217, which are used in conjunction with NAND 246 and inverters 243, and 244 to provide DATAOUT with the proper polarity. The p-type MOS transistor 210 is used when turning off receiver 202, as is n-type MOS transistor 212, which is used to ground the output at node 271.

As mentioned, the Bazes receiver is basically a self-biasing differential amplifier. The DATA signal is applied to the gates of the transistors 216 and 217, where transistors 216 and 217 form inverter 255 with an output at node 271. The VREF signal is applied to the coupled gates of transistors 214 and 215, where transistors 214 and 215 form inverter 256 with an output at node 270. The output signal from inverter 265 at node 270 is coupled to the gates of transistors 211 and 213. The transistors 211 and 213 are coupled to inverter 255. Thus, the output of inverter 265 bias the inverter 255 by adjusting the VDD and VSS for the transistor pair 216–217. With the inverter 255 coupled to the inverter 265, feedback is provided to the inverter 265, whose output is controlled by the VREF signal, which in turn adjusts the bias to inverter 255, which is controlled by the DATA signal. An output is taken at node 271, where transistors 216 and 217 are coupled together, for feeding data out receiver 102 through inverter 243, NAND gate 246, and inverter 244. The DATAOUT signal from 202 is the DATAOUT of data receiver 102 to be coupled to a latch, such as data latch 105 of FIG. 1.

The trip point of receiver 202 is the trip point of inverter 255, which is the level at which its output transitions between low and high. The trip point can be represented by the level at the output node 271 of inverter 255. The voltage at node 271 is controlled at the gates of inverter 255 by DATA, which as mentioned before is affected by the output at node 270 of inverter 265 controlled by VREF. There is no means for controlling the voltage at node 271 other than VREF and the DATA signal, which receiver 202 does not control. Thus, receiver 202 does not have a means to adjust its trip point.

The transistors in receiver 202 can be fabricated using processes known to those skilled in the art. In particular, p-type MOS transistor 214 and n-type MOS transistor 215 are fabricated as a CMOS transistor, as are p-type MOS transistor 216 and n-type MOS transistor 217.

Figure 4:
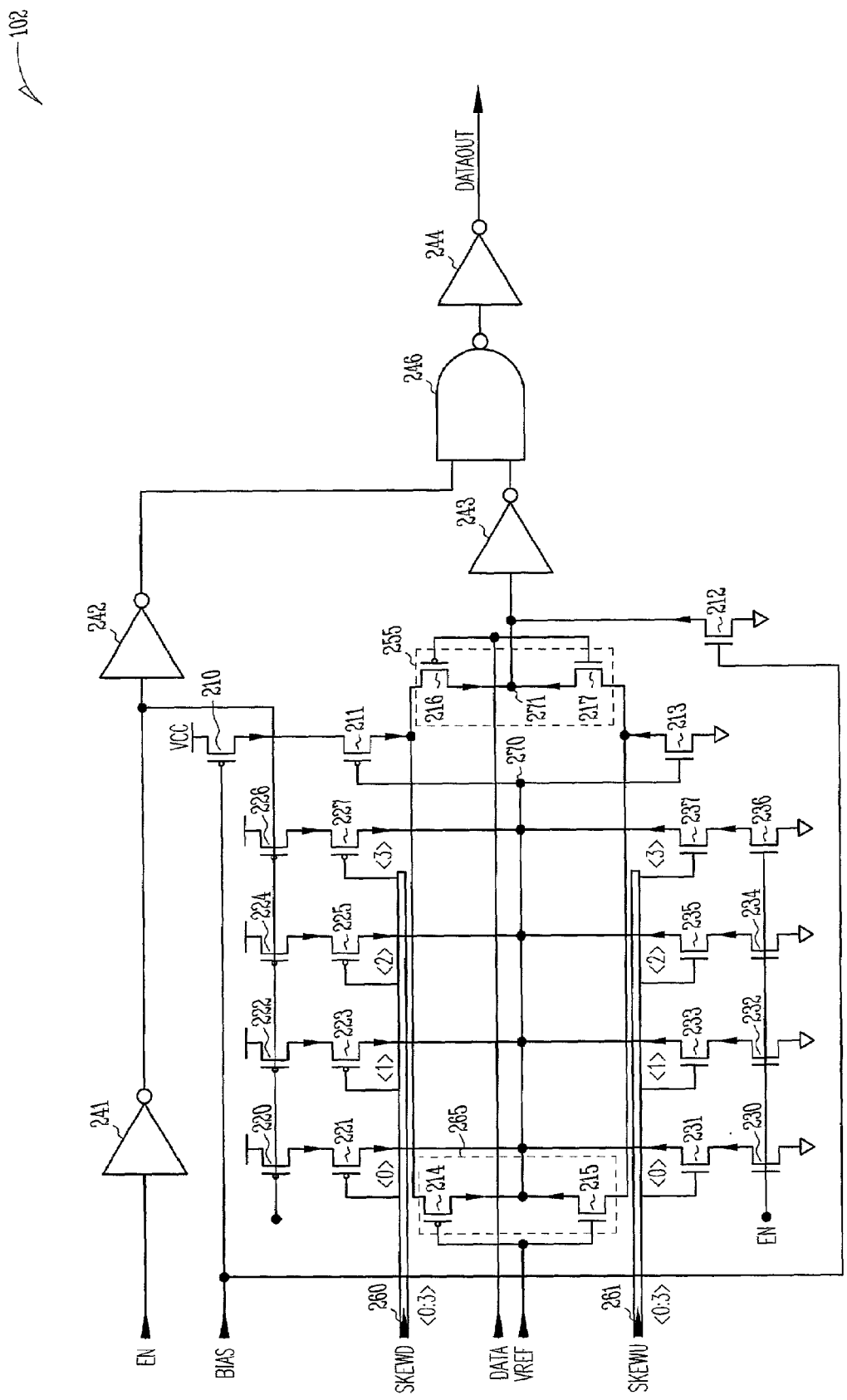
FIG. 4 depicts an exemplary schematic of a data receiver having a trip point adjustor in accordance with the present invention.

FIG. 4 depicts the basic elements for data receiver 102 including the coupling of receiver 202, and trip point adjustor 203 referenced in FIG. 2. The trip point adjustor, in an exemplary embodiment of the present invention, includes a set of eight p-type MOS transistors 220–227, and a set of eight n-type MOS transistors 230–237. The two sets of eight transistors are coupled at node 270, which is also a node common to transistors 211, 213–215 of receiver 202. Thus, driving the transistors of the trip point adjustor with signals received externally from data receiver 102, the voltage at node 270 of receiver 202 can be pulled up or pulled down affecting the trip point of data receiver 102.

The set of p-type MOS transistors, 220–227, of the trip point adjustor are coupled between node 270 and VCC. This set of eight transistors is configured as four transistor pairs in parallel, where the transistors in each transistor pair are coupled together in series. One of the two transistors acts as a switch transistor. The second of the two transistors is used as a load. These transistor pairs are designed to raise the voltage level at node 270 by an offset. Those skilled in the art will readily recognize that a resistor or other load circuit could be used in place of the second transistor. Raising the voltage level at node 270 by an offset lowers the trip point defined by inverter 255 of the receiver. The switch transistors 221, 223, 225, and 227 are coupled to a SKEWD port 260. The SKEWD port 260 comprises four inputs for receiving a 4-bit SKEWD vector <0:3>. Each input is coupled to the gate of one of the four switch transistors in a one to one manner such that one component of the SKEWD vector is applied to each transistor pair. For instance, SKEWD <0> is applied to the gate of 221 in the 220–221 pair. The SKEWD vector is a set of adjustment signals supplying voltage levels for controlling the set of transistors 220–227.

The set of n-type MOS transistors, 230–237, of the trip point adjustor are coupled between node 270 and ground. This set of eight transistors is configured as four transistor pairs in parallel, where the transistors in each transistor pair are coupled together in series. One of the two transistors acts as a switch transistor. The second of the two transistors is used as a load. These transistor pairs are designed to lower the voltage level at node 270 by an offset. Those skilled in the art will readily recognize that a resistor or other load circuit could be used in place of the second transistor. Lowering the voltage level at node 270 by an offset raises the trip point defined by inverter 255 of the receiver. The switch transistors 231, 233, 235, and 237 are coupled to a SKEWU port 261. The SKEWU port 261 comprises four inputs for receiving a 4-bit SKEWU vector <0:3>. Each input of SKEWU port 261 is coupled to the gate of one of the four switch transistors in a one to one manner such that one component of the SKEWU vector is applied to each transistor pair. For instance, SKEWU <0> is applied to the gate of 231 in the 230–231 pair. The SKEWU vector is a set of adjustment signals supplying voltage levels for controlling the set of transistors 230–237.

Each transistor pair is designed to apply a different amount of offset called a weighted offset. The weighting factor is determined by the ratio of a width, W, of the transistor to a transistor length, L, where the ratio is related to the resistance of the transistor, when the transistor is on. The resistance for each transistor pair is the sum of the resistance of the switching transistor and the load transistor. The four pairs of transistors, both for the set of p-type MOS transistors and for the set of n-type MOS transistors, act as four resistors in parallel, where the resistance of a pair that is turned off acts as an infinite resistance, and has no effect on the pull up or pull down of node 270, which lowers or raises, respectively, the trip point.

For the set of four pairs of p-type MOS transistors, the switch transistors 221, 223, 225, 227 have the same resistance, i.e., the same W/L ratio (20.0/1.0). The load transistors 220, 222, 224, 226 have a different relative weighting with respect to their length, L, while having the same width, W. The relative width, W, for the load transistors is set at 20.0. The relative lengths of the load transistors are 4.0 for load transistor 226, 8.0 for load transistor 224, 16.0 for load transistor 222, and 32.0 for load transistor 220. With such a weighting pattern, the weighting can be considered as a binary weighting. These relative lengths are scaled to actual dimensions dependent upon the shrinkage factor of the manufacturing process. The above relative dimensions were calculated for a process where W was set to 2.0 μm, and the lengths of the load transistors are 0.4 μm for load transistor 226, 0.8 μm for load transistor 224, 1.6 μm for load transistor 222, and 3.2 μm for load transistor 220. By turning on various combinations of p-type MOS transistor pairs, changes in the effective resistive of the set of p-type MOS transistors between node 270 and voltage supply VCC can be implemented. With the set of p-type MOS transistors turned off, the voltage level at node 270 is set by receiver 202 of FIG. 3. With one or more of the set of p-type MOS transistors on, the voltage at node 270 is raised by an offset depending on the combination of p-type MOS transistors turned on, lowering the trip point. With only transistor pair 220–221 on, the voltage at node 270 is raised about 10 mV in offset for a VCC of 1.8V. The offset, raising the voltage of node 270, pulls up node 270 resulting in a lowering of the trip point defined by inverter 255. Thus, this offset due to the set of p-type MOS transistors being on is a pull down of the trip point. The pull down offset provided from the set of p-type MOS transistors ranges from 0 to about 200 mV. The 0 mV offset occurs for the set of p-type MOS transistors turned off, which occurs when the gates of the switch transistors 221, 223, 225, 227 are set to a high level by a SKEWD vector <1,1,1,1>.

For the above discussion, the set of n-type MOS transistors also coupled at node 270 have not been considered. The adjustments provided to the n-type and p-type MOS transsisitors are only applied to one set. If the p-type MOS transistors are on, then the n-type transistors will be off, and vice-versa. Both sets can be turned on, but this would result in excessive current.

The weighting factors for the set of n-type MOS transistor are different than the p-type MOS transistors, since the drive strength is different for a n-type MOS transistors relative to a p-type MOS transistor. For the set of four pairs of n-type MOS transistors, the switch transistors 231, 233, 235, 237 have the same resistance, i.e., the same W/L ratio (1.2/0.2). The load transistors 230, 232, 234, 236 have a different relative weighting with respect to their length, L, while having the same width, W. The relative width, W, for the load transistors is set at 12.0. The relative lengths of the load transistors are 4.0 for load transistor 236, 8.0 for load transistor 234, 16.0 for load transistor 232, and 32.0 for load transistor 230. With such a weighting pattern, the weighting can be considered as a binary weighting. These relative lengths are scaled to actual dimensions dependent upon the shrinkage factor of the manufacturing process. The above relative dimensions were calculated for a process where W was set to 1.2 μm, and the lengths of the load transistors are 0.5 μm for load transistor 226, 0.9 μm for load transistor 224, 1.3 μm for load transistor 222, and 3.1 μm for load transistor 220. By turning on various combinations of n-type MOS transistor pairs, changes in the effective resistive of the set of n-type MOS transistors between node 270 and ground can be implemented. With the set of n-type MOS transistors turned off, the voltage level at node 270 is set by receiver 202 of FIG. 3. With one of more of the set of n-type MOS transistors on, the voltage at node 270 is lowered by an offset depending on the combination of n-type MOS transistors turned on. With only transistor pair 230–231 on, the voltage at node 270 is lowered about 10 mV in offset for a VCC of 1.8V. This offset, lowering the voltage of node 270, pulls down node 270, which raises the trip point of inverter 255. Thus, this offset due to the activated set of n-type MOS transistors is a pull up of the trip point. The pull up offset provided from the set of n-type MOS transistors ranges from 0 to about 200 mV. The 0 mV offset occurs for the set of n-type MOS transistors turned off, which occurs when the gates of the switch transistors 221, 223, 225, 227 are set to a low level by a SKEWU vector <0,0,0,0>.

For the above discussion regarding the set of n-type MOS transistors, the set of p-type MOS transistors also coupled at node 270 have not been considered. Further, it is understood that a low vector <0,0,0,0> corresponds to a set of low voltages for turning a set of n-type MOS transistors off, while a high vector <1,1,1,1> corresponds to a set of high voltages for turning a set of p-type MOS transistors off. Further, the SKEWD vector and the SKEWU vector are input to receiver 102, such that when one vector activates at least one transistor pair in the set of transistors to which it is coupled, the other vector turns off all the transistors to which its signal is being applied.

The SKEWD and SKEWU vectors supply signals to drive the switch transistors of the p-type MOS transistor pairs and the n-type MOS transistor pairs, respectively. This activates one or the other of the two sets of transistors in a set pattern adjusting the voltage at the node 270. Trip point adjustor 203 of FIG. 2 is continually provided skew adjustments for receiver 202 of FIG. 2, based on the received adjustment vectors. If data receiver 102 of FIG. 4 is operating at or approximately at (VCC/2) at startup, the adjustment vectors being supplied should be such that the two set of skew transistors are not providing any pull up or pull down, that is, adjustment vector SKEWD has the voltage levels for a vector <1,1,1,1>, and adjustment vector SKEWU has the voltage levels for a vector <0,0,0,0>.

The weighting factors for the two sets of eight skew transistors of FIG. 4 are chosen so that an approximate range of ±200 millivolts of trip point adjustment can be applied. Two sets of four transistor pairs, each transistor pair having a gate controlled by one of the components of the SKEWD and SKEWU adjustment vectors, are used to provide this offset. However, the number of transistor pairs in each set, which is also the number for the components of a corresponding adjustment vector, can range from one to a number appropriate for a particular application. Increasing the number of transistor pairs in a set increases the granularity of the offset for adjusting the trip point of the receiver. Associated with the increase number of skew transistors is an increase in the amount of the die used for fabricating a data receiver to include such a trip point adjustor. The weighting factors, number of components for the adjustment vectors, and other feature characteristics for the components of a data receiver can be determined in accordance with the present invention using standard simulation methods, as is known to those skilled in the art.

Figure 5:
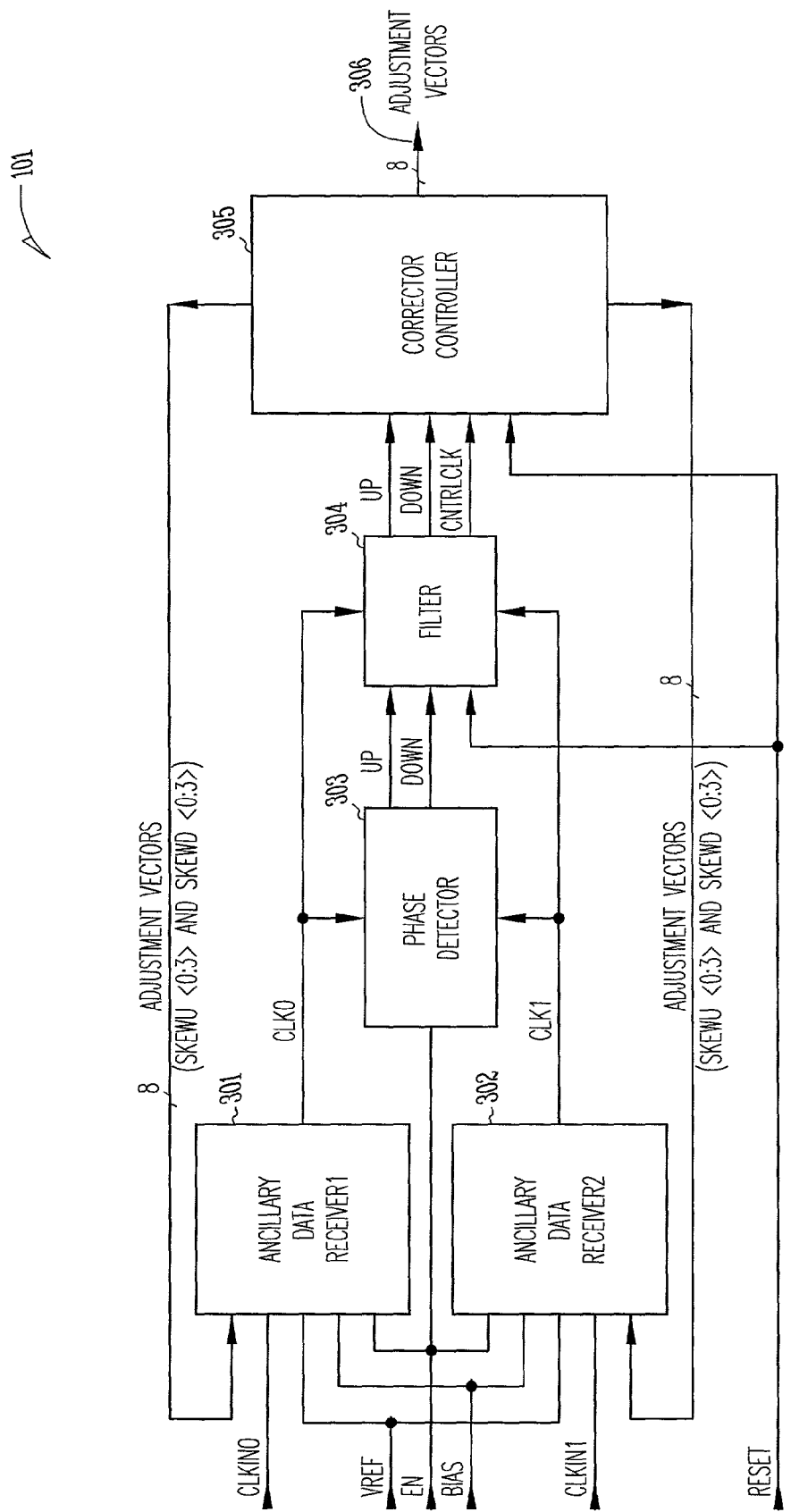
FIG. 5 is a block diagram depicting elements of the data corrector in accordance with the present invention.

In memory device 100 of FIG. 1, all data receivers are made in accordance with the present invention as described for data receiver 102 above. In addition, data corrector 101 includes a pair of ancillary data receivers 301, 302, as shown in FIG. 5, that are essentially identical to the data receivers 102a–102n of memory device 100. In FIG. 5, the use of the ancillary data receivers 301, 302 will be discussed in the detailed description of data corrector 101 provided below.

FIG. 5 depicts a data corrector 101 including a pair of ancillary data receivers 301, 302, and a corrector controller 305 coupled to each ancillary data receivers 301, 302 for providing adjustment vectors to the trip points of the ancillary data receivers 301, 302. Ancillary data receivers 301, 302 are data receivers in accordance with the present invention as described above. The data corrector 101 is used to correct offsets and timing skews in a data signal. However, a data signal is non-repetitive, making it a poor reference for data corrector 101. Advantageously, the data corrector uses received differential clock signals in conjunction with VREF to provide adjustment vectors. One received clock signal, CLKIN0, is coupled to ancillary data receiver 301 at its data input, referred to as DATA in FIG. 2. The other received clock signal, CLKIN1, is coupled to ancillary data receiver 302 at its data input, referred to as DATA in FIG. 2. As shown in FIG. 5, both ancillary data receivers 301, 302 are coupled to the reference voltage, VREF. The outputs, CLK0 and CLK1, of the two ancillary data receivers 301, 302, respectively, are coupled to phase detector 303. Phase detector 303 is enabled along with the ancillary data receivers by an EN signal. Phase detector 303 examines a crossing point of the two output signals, CLK0 and CLK1. If CLK0 and CLK1 do not cross concurrently at a signal transition from high to low for one signal, and low to high for the other signal, phase detector 303 generates an UP pulse or a DOWN pulse, depending upon which signal has a transition arriving at phase detector 303 first. Two lines, one for an UP pulse and one for a DOWN pulse, couple the output of phase detector 303 to a filter 304. In a sample time frame, the phase detector puts either a pulse on the UP pulse line or on the DOWN pulse line.

Filter 304 is a majority filter, which is a loop filter that does not make any changes, or corrections, until it receives a number of sample UP pulses or a number of sample DOWN pulses. The higher the sample number, the more noise is filtered out with an accompanying slow down of the loop. With a high number of samples, a slowed loop reduces the ability of data corrector 101 to track a fast variation about VREF, since the variations will have occurred before the filter allows a pulse to reach corrector controller 305. With a small number of samples the filter can follow faster transitions, but then the filter may over correct. If the loop filter is set too fast (too few samples), the loop may be unstable. The sample for filter 304 is four pulses. Alternately, the sample can be eight pulses. In addition to providing the UP pulse and the DOWN pulse to the corrector controller 305, filter 304 also provides a clock signal, CNTRLCLK, for use by corrector controller 305. The CNTRLCLK is generated from the CLK0 and CLK1 from the ancillary data receivers 301, 302. Filter 304 can be set to an initial condition using a RESET signal to zero the count of filter 304.

The UP and DOWN pulses from phase detector 303 are coupled to corrector controller 305 having passed the sample requirement of filter 304. An UP pulse to corrector controller 305 is a request for a skew up, or pull up, of the trip point of the ancillary data receivers 301, 302. Similarly, a DOWN pulse to corrector controller 305 is a request for a skew down, or pull down, of the trip point of the ancillary data receivers 301, 302. Corrector controller 305 counts the UP and DOWN pulses from filter 304 using a control clock signal, CNTRLCLK, provided by filter 304. Based on its count, corrector controller 305 provides adjustment vectors, SKEWU <0:3> and SKEWD <0:3>, that are coupled backed to ancillary data receivers 301, 302.

Once the adjustment vectors are coupled back to the ancillary data receivers 301, 302, the trip points of the ancillary data receivers 301, 302 are adjusted with their outputs modified relative to each other. The modified outputs, CLK0 and CLK1, are again compared by phase detector 303. Phase detector 303 provides a new UP or DOWN request, and corrector controller 305 supplies a new set of adjustment vectors to the ancillary data receivers 301, 302. This cycle continues until phase detector 303 determines that no further adjustments are necessary, that is, CLK0 and CLK1 voltage levels cross concurrently at the transition of the rising edge of one signal and the transition of the falling edge of the other signal. In practice the crossing is not perfectly at VCC/2, and the cylce continues. Additional complexity could be implemented such that when the crossing occurs within a predetermined delta of VCC/2, corrector controller 305 can send the same set of adjustment vectors to the ancillary data receivers 301, 302, which maintains the status of their trip points that resulted in the phase detector no longer requesting a UP pulse or a DOWN pulse. Also when this condition occurs, corrector controller 305 outputs the adjustment vectors at a port 306 for use by data receivers external to data corrector 101.

Figure 6:
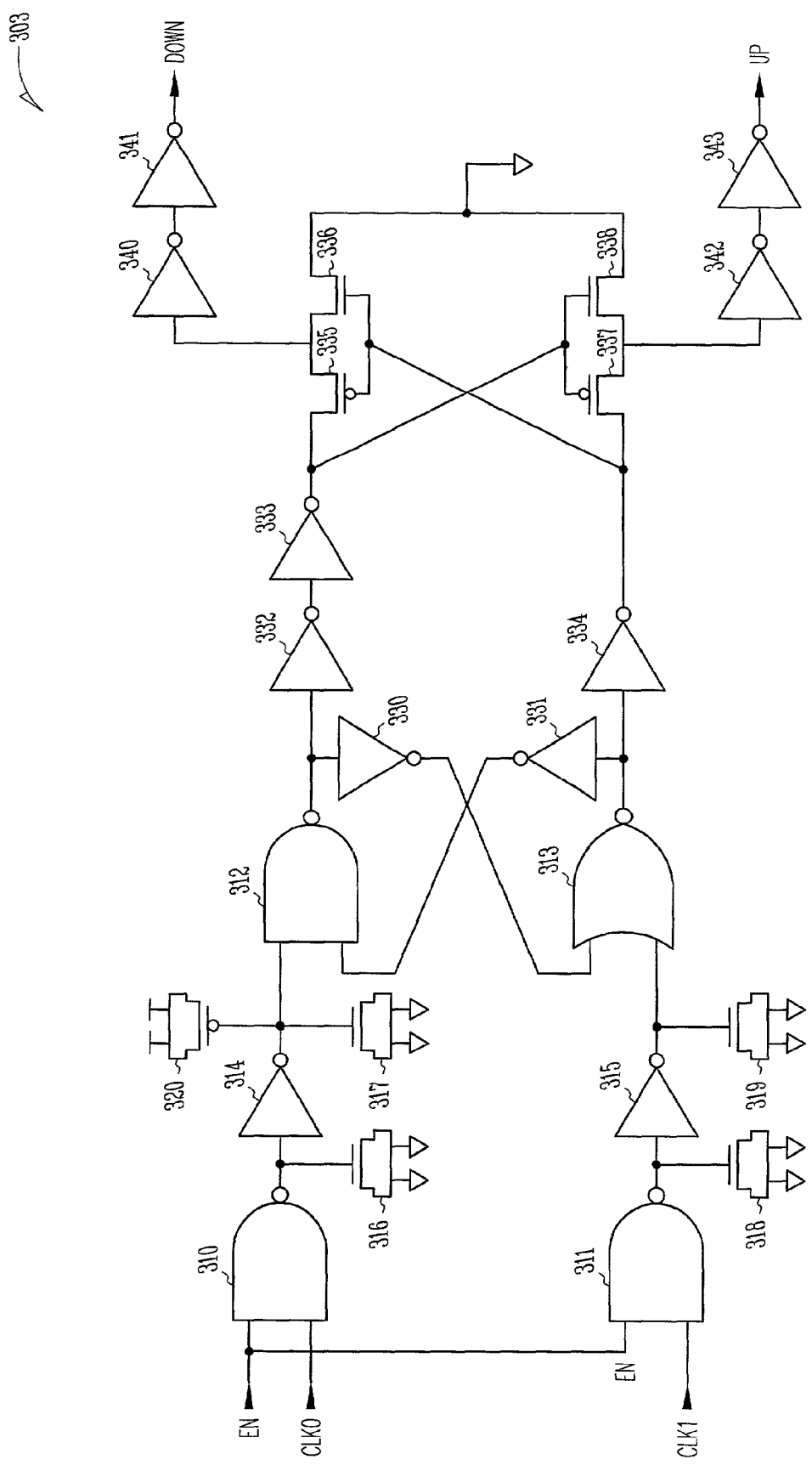
FIG. 6 depicts an exemplary schematic of a phase detector that provides signal balancing and detection of a zero crossing of signals in accordance with the present invention.

Phase detector 303 of FIG. 5 is shown in more detail in FIG. 6. FIG. 6 depicts phase detector 303 having elements for balancing differential clock signals and for detecting a zero crossing of the balanced differential clock signals. Two signals are balanced when corresponding characteristics of the two signals have the same or equivalent values or ranges, such as signal voltage swings or duty cycles. Two clock signals can also be balanced by adjusting the two signals so that the rise and fall times of the two clock signals are approximately equal. A zero crossing for two signals having defined transitions from a low to a high corresponds to the two signals crossing at the transition point from a low to a high (a high to a low) of each signal at the same time. A zero crossing also occurs when the low to high transition in a rising edge of one signal occurs at the same time as the high to low transition in a falling edge of the second signal.

In FIG. 6, phase detector 303 receives an output clock signal, CLK0, from ancillary data receiver 301, and an output clock signal, CLK1, from ancillary data receiver 302, as shown in FIG. 5. Phase Detector 303 then balances the rise and fall times of these two clock signals as they propagate through phase detector 303. The balanced clock signals are compared to determine a zero crossing of the two signals. The zero crossing in this instance occurs when the transition of a rising edge of one clock signal occurs concurrently with the transition of the falling edge of the other clock signal. If the two clock signals do not have a zero crossing, then the transitions for one clock signal will lead the transitions for the other clock signal. Phase detector 303 at its output places a pulse on the UP output if a transition occurs first in the CLK0 signal, and places a pulse on the DOWN output if a transition occurs first in the CLK1 signal.

The balancing of the two clock signals is performed using the two NAND gates 310, 311, inverters 314, 315, and capacitors 316–320. The capacitors 316–319 are n-type capacitors, each fabricated as a n-type transistor with its source and drain connected, while 320 is a p-type capacitor fabricated as a p-type transistor with its source and drain connected. These capacitors could be fabricated in other ways as is known to those skilled in the art. The amount of n-type capacitance and p-type capacitance at a given node are determined by matching n-type capacitance and p-type capacitance at the given node including the input gate capacitance with the result that the rise and fall times of the two signals, CLK0 and CLK1, match as they propagate through the circuit. Through simulation of the circuit depicted in FIG. 6, the drive strengths for the circuit elements can be determined. Standard methods of simulation can be used that are known to those skilled in the art.

Typically, phase detectors compare either a rising edge of a signal to a rising edge of another signal, or a falling edge of a signal to a falling edge of another signal. Significantly, phase detector 303 in accordance with the present invention, compares a rising edge of a clock signal to a falling edge of another clock signal. This comparison is performed using a NAND gate 312 and a NOR gate 313 with CLK0 coupled through the balancing circuit of phase detector 303 to the NAND gate 312, and CLK1 coupled through the balancing circuit to the NOR gate 313. Further, the output of the NAND gate 312 is coupled though inverter 330 to the input of the NOR gate 313, while, similarly, the output of the NOR gate 313 is coupled through inverter 331 to the input of NAND gate 312. The output of NAND gate 312 is coupled through inverters 332, 333 to a transmission gate formed by transistors 335–338. The output of NOR gate 313 is coupled through inverter 334 to a transmission gate formed by transistors 335–338. Transistors 335, 337 are p-type MOS transistors, while transistors 336, 338 are n-type MOS transistors. The result, from determining whether a zero crossing of the two signals CLK0 and CLK1 has occurred, is coupled out through inverters 340–341 and inverters 342–343.

Phase detector 303 has two outputs, UP and DOWN. With a pulse (a high signal) on either UP or DOWN, the phase detector has determined that the transitions in the rising edge and the falling edge of the two signals CLK0 and CLK1 have not crossed concurrently. The high signal will be set according to whichever of the two signals CLK0 and CLK1 makes its signal transition first. With phase detector 303 used in data corrector 101 as depicted in FIG. 5, a high for the UP output is a request for a shift up, while a high for the DOWN output is a request for a shift down. The requests are provided to corrector controller 305, which uses the request to generate adjustment vectors.

Figure 7:
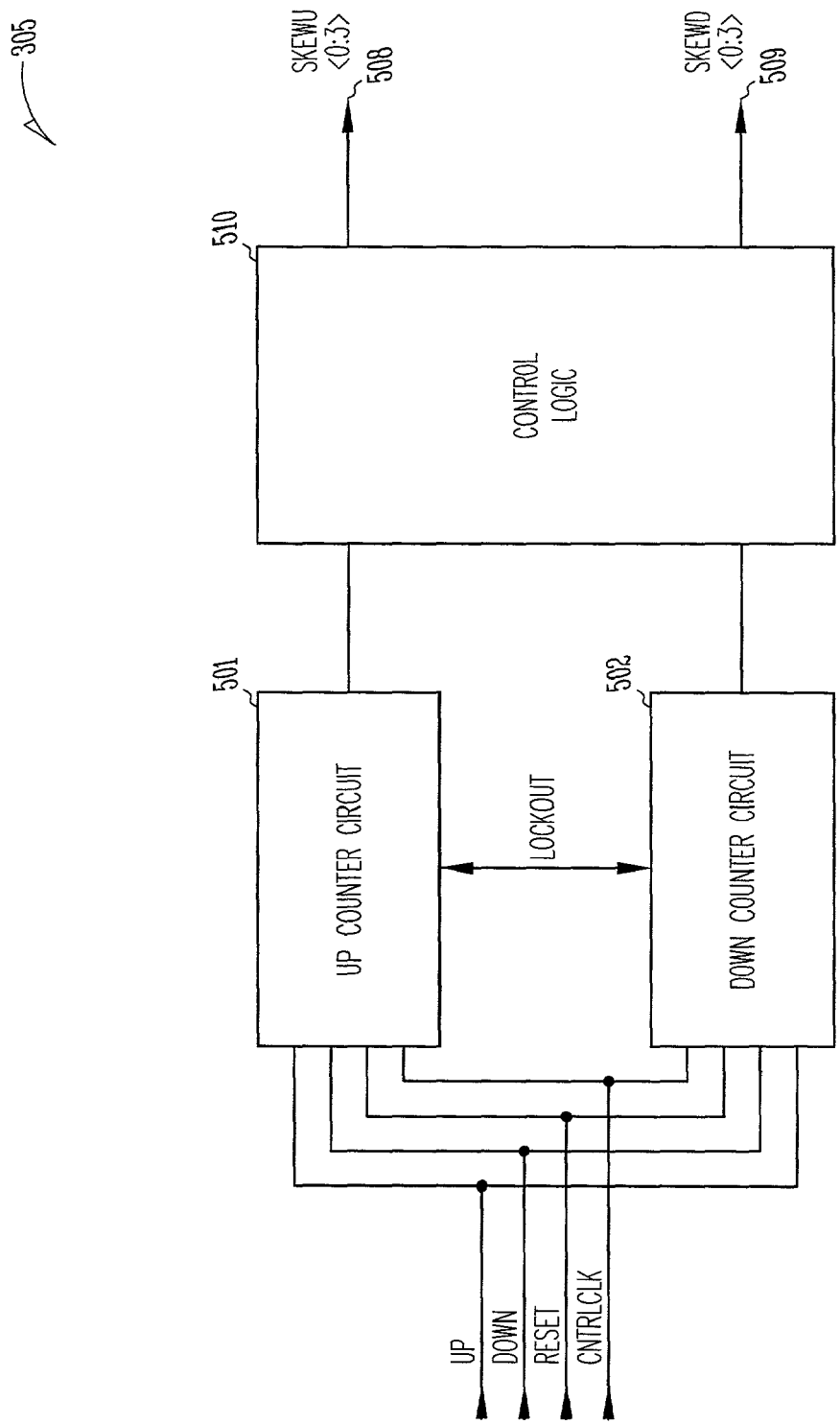
FIG. 7 depicts a block diagram of a corrector controller for providing adjustment vectors in accordance with the present invention.

FIG. 7 is a block diagram of the basic elements of corrector controller 305. Inputs to corrector controller 305 include a request, UP, for pulling up the trip point of the ancillary data receivers 301, 302 of FIG. 5, and a request, DOWN, for pulling down the trip point of the ancillary data receivers 301, 302. Corrector controller 305 counts the requests in an UP counter circuit 501 and a DOWN counter circuit 502, using a CNTRLCLK clock signal to clock the counters in the UP counter circuit 501 and the DOWN counter circuit 502. Each time a UP or DOWN request occurs, the UP counter circuit 501 or the DOWN counter circuit 502 increase their count accordingly. Only one counter counts at a time. A LOCKOUT is provided between the UP counter circuit 501 and the DOWN counter circuit 502, sot that only one counts. Both counter circuits 501, 502 include four counters which provide the outputs of corrector controller 305 as determined by control logic 510. The four counters of the UP counter circuit 501 provide the 4-bit SKEWU <0:3> vector at output 508. The four counters of the DOWN counter circuit 502 provide the 4-bit SKEWD <0:3> vector at output 509.

When data corrector 101 of FIG. 5 is first powered up, data corrector 101 starts in a condition such that the outputs of the counter circuit 501, 502 provide no offset adjustment to the ancillary data receivers 301, 302 of FIG. 5. The signal that places data corrector 101 into this initial condition is provided by the RESET input. In the initial condition, the RESET signal sets the counters of the counter circuits 501, 502 to zero. This zeroing of the counters results in the signals in the SKEWU vector being all low, and the signals in the SKEWD vector being all high. Subsequently, unless the ancillary data receivers 301, 302 are operating without any data offsets with respect to (VCC/2), phase detector 303 of FIG. 5 will determine a request for a shift UP or a shift DOWN of the trip points of the ancillary data receives 301, 302. Assuming an UP request is received by corrector controller 305, the request will cause the UP counter circuit 501 to increase its count. Corrector controller 305 will generate adjustment vectors that reflect the UP request. The resulting vector SKEWU at output 508 and the SKEWD vector at output 509 reflect that the adjustment is skewed from the previous correction cycle, or adjustment cycle, towards pulling up the trip point of the ancillary data receivers 301, 302.

When the trip point is so adjusted, the duty cycle of the differential clock signals, CLKIN0 and CLKIN1, (input as data signals to the ancillary data receivers 301, 302 of FIG. 5) is changed. The output signals of the ancillary data receivers, CLK0 and CLK1, are again compared by phase detector 303 of FIG. 5. If the previous pull up adjustment is too much, corrector controller 305 receives a DOWN request, and if the previous pull up adjustment is not enough, corrector controller 305 receives a UP request. This cycle continues tracking any offsets in the ancillary data receivers 301, 302 until a zero crossing of CLK0 and CLK1 occurs. Once CLK0 and CLK1 transitions cross concurrently, corrector controller 305 continues to supply the same adjustment vectors according to the UP or DOWN request received. The adaptive adjustment of the ancillary data receivers 301, 302 occurs in data corrector 101 in the configuration shown in FIG. 5. The data receivers 102a–102n of FIG. 1 are not adjusted in the same manner as the ancillary data receivers 301, 302. Corrector controller 305 supplies adjustment vectors to the data receivers 102a–102n only when the data correct controller 305 in its control logic 510 has determined that the adjustment vectors require no additional, significant changes.

Figure 8:
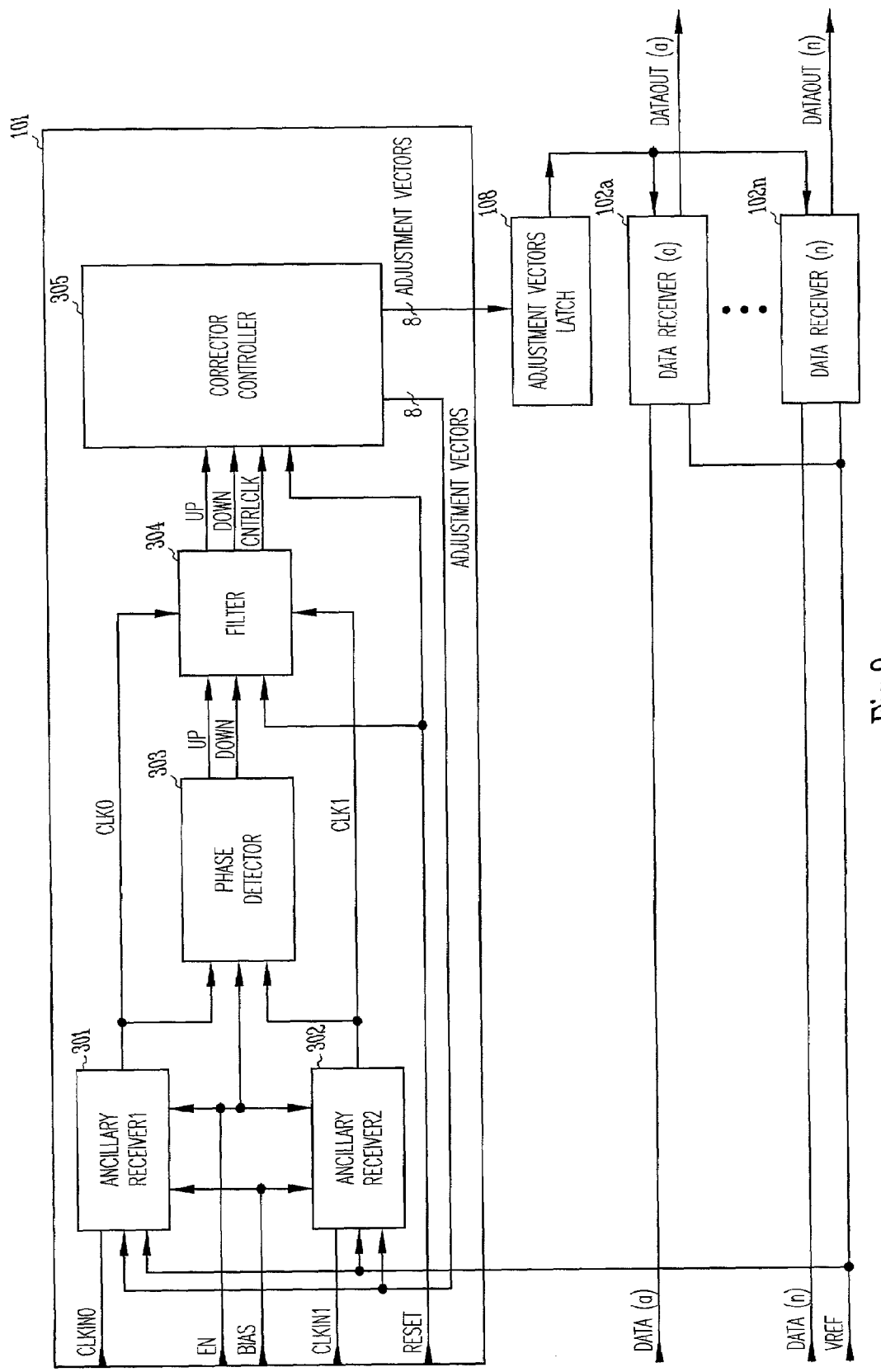
FIG. 8 depicts a block diagram of portions of the elements of a data corrector used to adjust trip points of a set of data receivers.

FIG. 8 depicts portions of the elements of data corrector 101 of FIG. 5 in relation to the data receivers 102a–102n of FIG. 1 for operating the data corrector in accordance with the present invention. A method of operating a data corrector 101 includes providing differential clock signals to a pair of ancillary data receivers 301, 302, determining a difference between the output signals of the ancillary data receivers 301, 302, and generating adjustment vectors correlated to the difference in the output signals of the ancillary data receivers. One differential clock signal, CLKIN0, is coupled to the data port of ancillary data receiver 301, and the other clock signal, CLKIN1, is coupled to the data port of ancillary data receiver 302. The adjustment vectors generated in corrector controller 305 are coupled back to the pair of ancillary data receivers 301, 302 to adjust the trip points of the ancillary data receivers 301, 302.

Since the method uses continuously cycling clock signals, with definite transitions, data corrector 101 is continually supplying the ancillary data receivers 301, 302 with adjustment vectors. In practical terms, phase detector 303 will not detect a perfect zero crossing of the output signals, CLK0 and CLK1, from the ancillary data receivers 301, 302. Therefore, phase detector 303 continually provides an UP or DOWN request. The combination of the count in the filter 304 and the control logic of the corrector controller 305 determines when that there is no appreciable offset in the ancillary data receivers 301, 302. The final set of adjustment vectors determined to have provided the adjustment to ancillary data receivers 301, 302 can be provided to data receivers 102a–102n. The data receivers 102a–102n function in a system as data receivers, as opposed to the ancillary data receivers 301, 302 of data corrector 101, which receive clock signals as data for the process of determining the set of adjustment vectors that will correct for data signal offsets.

Data corrector 101 will maintain the final adjustment vectors in a latch 108, and control the transfer of the adjustment vectors from the latch to data receivers external to the adjustment process, such as data receivers 102a–102n. Data corrector 101 determines whether the data receivers 102a–102n to receive the adjustment vectors are in a quiet period. For example, a quiet period would constitute a time period in which system data is not being transferred into or out of the data receivers. The adjustment vectors are transferred to the data receivers 102a–102n to adjust their trip points during these quiet points to avoid any glitches that may be associated with changing a trip point during data processing.

As a system having data receivers operates, the data receivers, such as data receivers 102a–102n, may experience periodic data offsets. Since data corrector 101 is continuously operating, new occurrences of data offsets, such as data offsets due to variations in VREF, will be detected by data corrector 101, which will continue its process of generating adjustment vectors. Data corrector 101 supplies a corrected adjustment vector from corrector controller 305 to the data receivers 102a–102n, once data corrector 101 has determined that this corrected adjustment vector has adjusted for the offsets in the ancillary data receivers 301, 302 of data corrector 101. In this manner, data corrector 101 adaptively provides trip point adjustments to data receivers 102a–102n to which it is coupled.

Data corrector 101, the ancillary data receivers 301, 302, and the data receivers 102a–102n in this method of the present invention have been previously described above. The data receivers 301, 302 and the ancillary data receivers 102a–102n have the same design. The data receivers 102a–102n and the ancillary data receivers 301, 302 differ in use, where the data to the data receivers 102a–102n is an actual data signal, while the data to each ancillary data receiver 301, 302 is a clock signal. This method in accordance with the present invention allows commands and data to be received in data receivers that have been corrected for any data offsets relative to VREF or any imbalances in the data receivers themselves.

A method for operating an electronic device, data receiver, memory device, or other system that requires adjustments to correct for offsets in a data signal has its best results when the data signal and the clock signals used to generate adjustment signals are derived from the same source. Typically, data signals and clock signals from a common source have the same levels of voltage swing. Using clock signals as inputs to a data corrector circuit, the clock signals are expected to swing between the same voltage levels as the data signals swing in a data receiving unit that is to be adjusted. Preferably, the data signal and clock signals come from the same chipset. However, the present invention is not limited for use where clock signals and data have a common source.

The method in accordance with the present invention can be used for applications involving a reference signal, either generated internally or externally to an electronic device, associated with signaling connected to a bus. Further, the adjustment vectors rather than digital signals (high, low voltage levels) could comprise analog control voltages for adjusting the trip point, or threshold transition, of an electronic device. Obviously, noise problems associated with distributing analog signals make the digital approach more advantageous.

Figure 9:
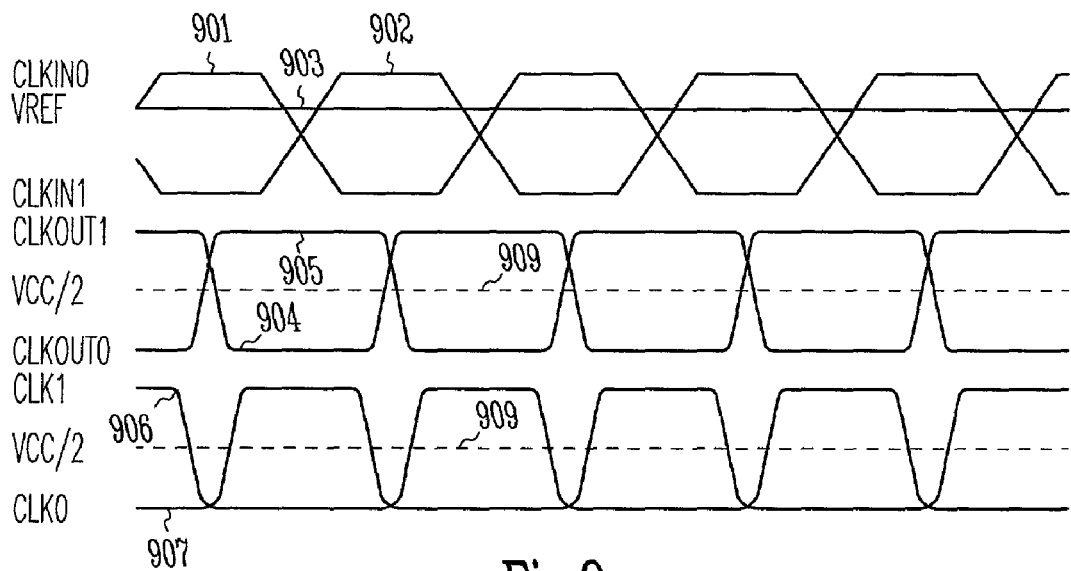
FIG. 9 depicts timing diagrams for a data corrector operating without adjustment vector correction.

In FIG. 9 shows timing diagrams for a data corrector operating without adjustment vector correction from a simulation of the operation and design of the data corrector in accordance with the present invention. One timing diagram depicts the system differential clock signals, CLKIN0 901 and CLKIN1 902, which are coupled to data corrector 101 as shown in FIG. 5. CLKIN0 is coupled at the data input to ancillary data receiver 301. CLKIN1 is coupled at the data input to ancillary data receiver 302. Both ancillary data receivers are coupled to VREF 903, which has a voltage level of 0.825 mV. CLKIN0 and CLKIN1 range from about 0.225 mV to about 1.025 mV. A second timing diagram shows the clock signals, CLKOUT1 904 and CLKOUT0 905, which are generated from CLKIN1 and CLKIN0 in the internal clock unit 109 used in memory device 100 of FIG. 1. CLKOUT0 and CLKOUT1 range from about 0.0 mV to about 1.60 mV. The third timing diagram shows the clock signal, CLK1 906, at the output of ancillary data receiver 302 having CLKIN1 as its data input. Also shown in the third timing diagram is the clock signal, CLK0 907, at the output of ancillary data receiver 301 having CLKIN0 as its data input. CLK0 and CLK1 also range from about 0.0 mV to about 1.60 mV. With no appreciable data offsets or timing skews, the CLK1/CLK0 pattern should resemble the CLKOUT1/CLKOUT0 pattern. The pattern shown in FIG. 9 indicates the presence of data offsets and timing skews, as the outputs of the ancillary data receivers 301, 302 cross at approximately 0 mV. The CLK1/CLK0 pattern should cross near (VCC/2) 909.

Figure 10:
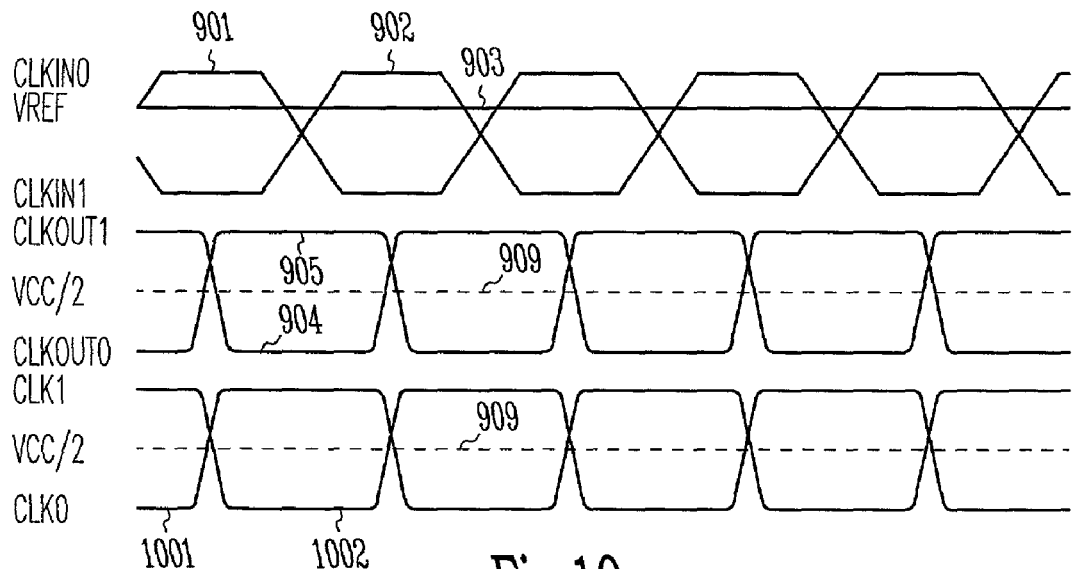
FIG. 10 depicts timing diagrams for a data receiver operating with adjustment vector correction in accordance with the present invention.

FIG. 10 shows timing diagrams for a data corrector operating with adjustment vector correction from a simulation of the operation and design of the data corrector in accordance with the present invention. One timing diagram depicts the system differential clock signals, CLKIN0 901 and CLKIN1 902, which are coupled to data corrector 101 as shown in FIG. 5. CLKIN0 is coupled at the data input to ancillary data receiver 301. CLKIN1 is coupled at the data input to ancillary data receiver 302. CLKIN0 and CLKIN1 range from about 0.225 mV to about 1.025 mV. Both ancillary data receivers are coupled to VREF 903, which has a voltage level of 0.825 mV. A second timing diagram shows the clock signals, CLKOUT1 904 and CLKOUT0 905, which are generated from CLKIN1 and CLKIN0 in the internal clock unit 109 used in memory device 100 of FIG. 1. CLKOUT0 and CLKOUT1 range from about 0.0 mV to about 1.60 mV. The third timing diagram shows the clock signal, CLK1 1002, at the output of ancillary data receiver 302 having CLKIN1 as its data input. Also shown in the third timing diagram is the clock signal, CLK0 1001, at the output of ancillary data receiver 301 having CLKIN0 as its data input. CLK0 and CLK1 also range from about 0.0 mV to about 1.60 mV. With no appreciable data offsets or timing skews, the CLK1/CLK0 pattern should resemble the CLKOUT1/CLKOUT0 pattern. The pattern shown indicates that the data corrector is adjusting the trip point of the ancillary data receivers 301, 302, since the CLK1/CLK0 pattern crosses near (VCC/2) 909. The crossing points do not occur at exactly the same level in each time frame, as the trip points are being adaptively adjusted over several cycles. However, the crossing point has been moved to near (VCC/2) 909.

Figure 11:
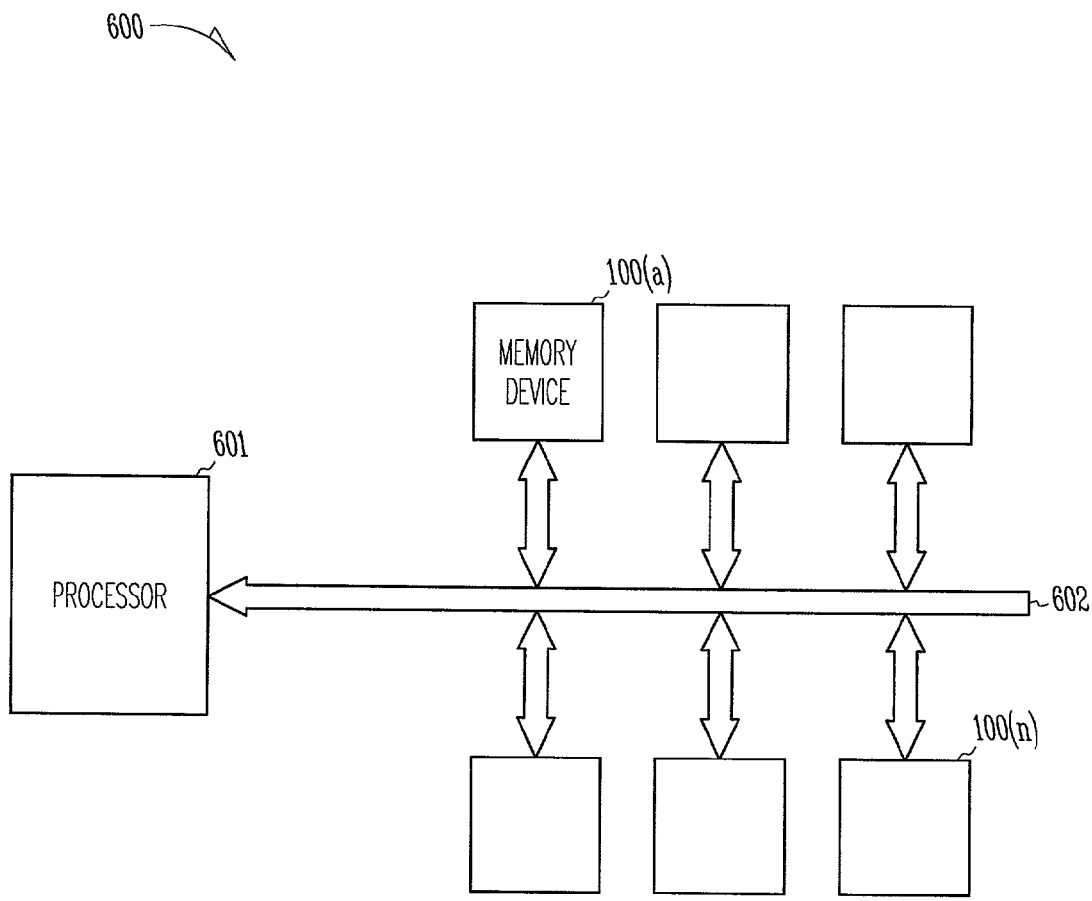
FIG. 11 depicts a processing system having memory devices in accordance with the present invention.

FIG. 11 depicts a processing system 600 including, among other elements, a processor 601, a data bus 602, and set of memory devices 100(a)–100(n), in accordance with the present invention. The processor 601 and memory bus 602 are designed, made, and operated in accordance with standard practices as known to those skilled in the art. The set of memory device 100(a)–100(n) are made and operated in accordance with the present invention. The memory devices 100(a)–100(n) have data receivers with trip points adaptively adjusted to correct offsets and timing skews in the data signals to these data receivers. The processing system 600 may also include other memory devices that are not made or operated in the same manner as memory devices 100(a)–100(n). Processor 601 may also include the present invention.

The illustrated embodiments may be changed, modified, and/or implemented using various circuit types and arrangements. Those skilled in the art will readily recognize that such modifications and changes may be made to the present invention without strictly following the exemplary embodiments and applications illustrated and described herein, and without departing from the true spirit and scope of the present invention which is set forth in the following claims.

What is claimed is:

1. An electronic device comprising:
   a data receiver having a trip point adjustor; and
   a data corrector coupled to the data receiver to adaptively provide trip point adjustment information to the trip point adjustor, the data corrector responsive to differential clock signals and a reference to generate the adjustment information.

2. The electronic device of claim 1, wherein the trip point adjustment information comprises analog control voltages.

3. The electronic device of claim 1, wherein the trip point adjustor includes a plurality of weighted p-type transistors and a plurality of weighted n-type transistors responsive to the adjustment information.

4. The electronic device of claim 1, wherein the data corrector includes inputs to receive the differential clock signals as data signals.

5. The electronic device of claim 1, wherein the data corrector includes a phase detector coupled to a filter, the phase detector and the filter to correlate differences between paired differential clock signals.

6. An electronic device comprising:
a data receiver having a trip point adjustor;
a data corrector coupled to the data receiver to adaptively provide trip point adjustment information to the trip point adjustor; and
a latch coupled between the data corrector and the data receiver to conditionally provide trip point adjustment information to the trip point adjustor of the data receiver.

7. The electronic device of claim 6, wherein the latch and the data corrector are configured to provide the adjustment information in a time period during which data is not transferred into or out of the data receiver.

8. The electronic device of claim 6, wherein the latch is coupled to a plurality of data receivers to adaptively provide trip point adjustment information to each data receiver.

9. An integrated circuit comprising:
a data receiver having a trip point adjustor; and
a data corrector coupled to the data receiver to adaptively provide trip point adjustment signals to the trip point adjustor, the data corrector responsive to differential clock signals and a reference to generate the adjustment information.

10. The integrated circuit of claim 9, wherein the trip point adjustor includes a plurality of p-type transistors with different width to length ratios, the plurality of p-type transistors responsive to the adjustment information.

11. The integrated circuit of claim 9, wherein the integrated circuit includes inputs to receive system clocks and a voltage reference to couple to the data corrector.

12. A memory device comprising:
a data receiver having a trip point adjustor; and
a data corrector coupled to the data receiver to adaptively provide trip point adjustment information to the trip point adjustor of the data receiver, the data corrector responsive to differential clock signals and a reference to generate the adjustment information.

13. The memory device of claim 12, wherein the memory is configured to receive a voltage reference external to the memory device as the reference.

14. The memory device of claim 12, wherein the differential clock signals include free running clock signals.

15. The memory device of claim 12, wherein the memory device includes a memory array to store data input to the data receiver.

16. The memory device of claim 15, wherein the memory device includes a data latch interposed between the data receiver and the memory array.

17. A memory device comprising:
a data receiver having a trip point adjustor;
a data corrector coupled to the data receiver to adaptively provide trip point adjustment information to the trip point adjustor of the data receiver; and
a latch coupled between the data corrector and the data receiver to conditionally provide trip point adjustment information to the trip point adjustor of the data receiver.

18. The memory device of claim 17, wherein the latch is configured to hold an eight bit adjustment vector.

19. The memory device of claim 17, wherein the trip point adjustor has a trip point adjustment range of ±200 millivolts.

20. A processing system comprising:
a processor; and
a memory device coupled to the processor, the memory device comprising:
a plurality of data receivers, each data receiver having a trip point adjustor; and
a data corrector coupled to each data receiver to adaptively provide trip point adjustment information to the trip point adjustor of each data receiver, the data corrector responsive to differential clock signals and a reference to generate the adjustment information.

21. The processing system of claim 20, wherein the data corrector has inputs to receive external differential clock signals and an external voltage reference, wherein the data corrector is responsive to the external differential clock signals and the external voltage reference to generate the adjustment information.

22. The processing system of claim 20, wherein the data corrector includes a phase detector coupled to a filter, the phase detector and the filter to correlate differences between paired differential clock signals.

23. The processing system of claim 20, wherein the processing system includes a data bus to couple the processor to the memory device.

24. The processing system of claim 20, wherein the differential clock signals include system clocks.

* * * * *